(12) United States Patent
Gallagher et al.

(10) Patent No.: US 6,242,748 B1
(45) Date of Patent: Jun. 5, 2001

(54) METHODS AND APPARATUS FOR MOUNTING AN X-RAY DETECTING UNIT TO AN ELECTRON MICROSCOPE

(75) Inventors: Brian William Gallagher, Highland Lakes, NJ (US); Branimir Vidinsky, Glen Cove, NY (US)

(73) Assignee: EDAX, Inc., DE (US)

( * ) Notice: Subject to any disclaimer, the term of this patent is extended or adjusted under 35 U.S.C. 154(b) by 0 days.

(21) Appl. No.: 09/371,545

(22) Filed: Aug. 10, 1999

(51) Int. Cl.[7] .................................................. H01J 37/244
(52) U.S. Cl. .............................................................. 250/397
(58) Field of Search ............................... 250/397; 403/372

(56) References Cited

U.S. PATENT DOCUMENTS

| | | | |
|---|---|---|---|
| 4,097,164 | * 6/1978 | Campbell | 403/372 |
| 5,127,807 | * 7/1992 | Eslinger | 417/360 |
| 5,376,799 | * 12/1994 | Schamber et al. | 250/441.11 |
| 5,552,608 | * 9/1996 | Gallagher et al. | 250/397 |

* cited by examiner

*Primary Examiner*—Jack Berman
(74) *Attorney, Agent, or Firm*—Armstrong Teasdale LLP

(57) ABSTRACT

A mounting system includes a port cover, a mounting interface, and a damping system. The port cover is attached to a microscope and secures the mounting interface to the microscope. The mounting interface provides a mounting surface for an X-ray detector unit to attach to the microscope and a surface to which the damping system is attached. The damping system includes a plurality of collets, a collet clamp, and damping material. The damping system secures the X-ray detector unit to the microscope while damping vibrations caused by the detector unit.

28 Claims, 2 Drawing Sheets

METHODS AND APPARATUS FOR MOUNTING AN X-RAY DETECTING UNIT TO AN ELECTRON MICROSCOPE

BACKGROUND OF THE INVENTION

This invention relates generally to mounting systems and, more particularly, to mounting systems for mounting an X-ray detecting unit to an electron microscope.

In recent years, it has become increasingly important to accurately analyze physical properties of microscopic regions using X-rays and microscopic images. In order to perform such analysis, a high power electron microscopes and high power X-ray detectors are utilized. Although the high power improves the operation of the X-ray detector, it also generates electronic noise. To reduce the electronic noise, a cooling system pumps liquid nitrogen through the X-ray detector. Although the cooling system controls the temperature of the X-ray detector, it also generates vibrations which are transmitted through the X-ray detector to the electron microscope.

Typically, mounting systems for mounting X-ray detectors to electron microscopes use a solid-mounting or solid structure type of port cover as a mounting platform. The platform is positioned between the X-ray detector and the microscope. A damping material is applied to the outside of the port cover. In an effort to eliminate the induced vibration, elaborate damping solid structures have been utilized. Such structures which are bulky and expensive.

BRIEF SUMMARY OF THE INVENTION

In an exemplary embodiment, a mounting system includes a port cover, a mounting interface, and a damping system. The port cover is attached to an electron microscope and the mounting interface is attached to the port cover. The damping system includes a plurality of collets, a collet clamp, and damping material. The damping material is attached directly to an outer surface of the mounting interface and the collets are then attached to the damping material. The collet clamp and port cover include integral wedges.

In operation, the integral wedges on the collet clamp and port cover force the collets to clamp against the mounting interface as the collet clamp is tightened. The clamping holds the detector such that the vibrations induced by the coolant system in the X-ray detector pass through the damping material. As such, a load path of the vibrations is through the damping material.

The mounting system eliminates a need for more costly and complicated mounting system damping equipment and is easily assembled. In addition, the system is compact in size, has a high damping efficiency, and provides a minimal static deflection when subjected to a load.

DETAILED DESCRIPTION OF THE INVENTION

Figure 1:
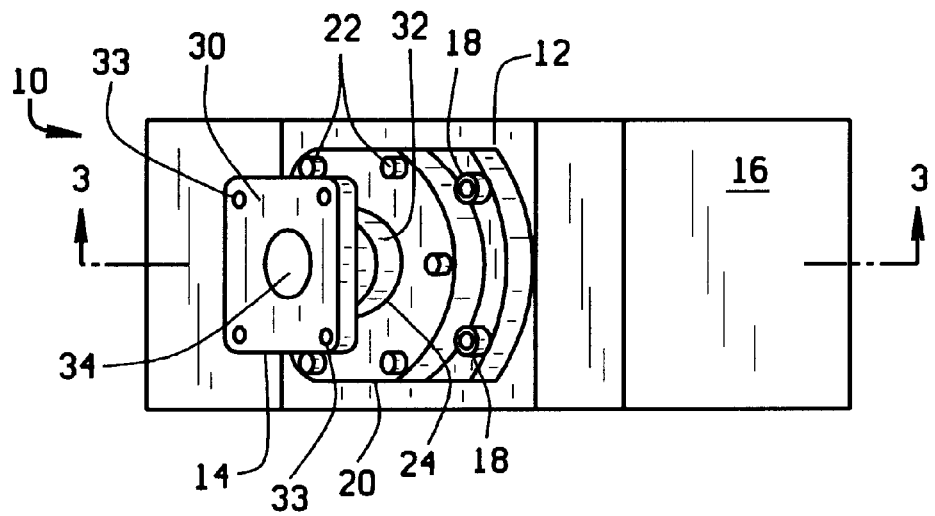
FIG. 1 is a top perspective view of a mounting system in accordance with the present invention.

FIG. 1 is a top perspective view of a mounting system 10 including a port cover 12 and a detecting unit flange 14. Port cover 12 is secured to an electron microscope 16 with a plurality of threaded fasteners 18 which extend through port cover 12 into a plurality of threaded openings (not shown in FIG. 1) disposed within microscope 16. Port cover 12 is substantially annular in shape and includes an opening (not shown in FIG. 1). Port cover 12 mounts flush against microscope 16 and provides a mounting structure upon which a detecting unit (not shown) is attached.

A collet clamp 20 is mounted flush against port cover 12 with a plurality of threaded fasteners 22 which extend through collet clamp 20 into a plurality of threaded openings (not shown in FIG. 1) in port cover 12. Collet clamp 20 includes a plurality of integral wedges (not shown in FIG. 1) which secure detecting unit flange 14 to port cover 12 when collet clamp 20 is tightened with fasteners 22. Collet clamp 20 is annular in shape and includes an opening 24 through which detecting unit flange 14 extends inwardly through port cover 12 towards microscope 16 and through the opening in port cover 12. Opening 24 is positioned substantially concentrically to the opening in port cover 12.

Detecting unit flange 14 includes a mounting body 30 and a tube shaft 32. Mounting body 30 is rectangular in shape and includes a plurality of openings 33 through which a plurality of fasteners (not shown) extend to securely mount the X-ray detector unit to detecting unit flange 14. Detecting unit flange 14 also includes a central opening 34 positioned concentrically above opening 24. Opening 34 provides access to microscope 16 and permits a detecting crystal (not shown) to be inserted within a stainless steel cap (not shown) which extends through opening 34 into microscope 16. Additionally, opening 34 provides an access for a cooling path utilized by the X-ray detector unit cooling system (not shown). Tube shaft 32 extends through collet clamp 20 which secures tube shaft 32 to port cover 12 when collet clamp 20 is tightened with fasteners 22.

Figure 2:
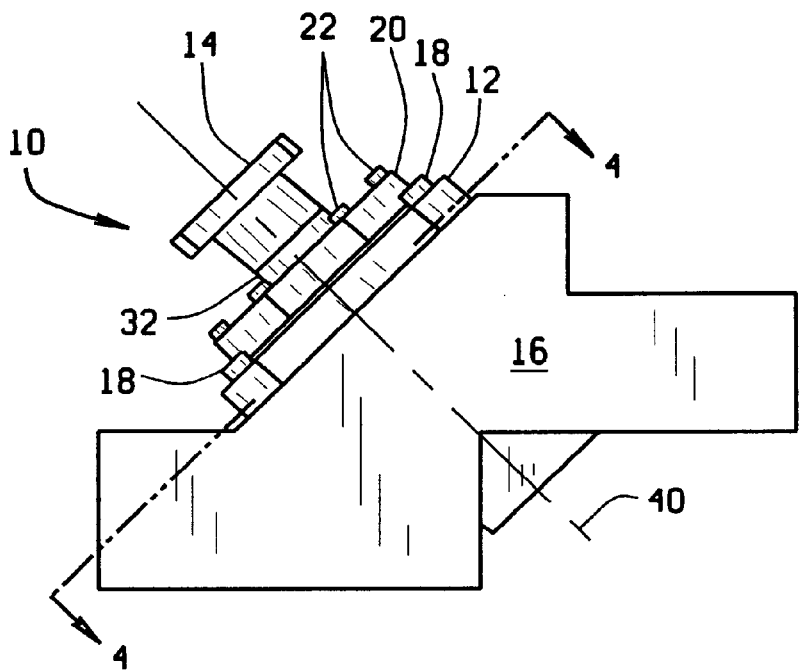
FIG. 2 is a side plan view of the mounting system shown in FIG. 1.

FIG. 2 is a side plan view of mounting system 10 illustrating port cover 12 attached to microscope 16 with threaded fasteners 18. Collet clamp 20 is attached to port cover 12 with threaded fasteners 22 which engage openings (not shown) disposed within port cover 12. Mounting system 10 includes an axis of symmetry 40. Port cover 12, collet clamp 20, and detecting unit flange 14 are all mounted substantially symmetrically with axis of symmetry 40. Tube shaft 32 extends through collet clamp 20 and through port cover 12. As fasteners 22 are tightened to port cover 12, collet clamp 20 is drawn tighter against port cover 12 and as is explained in more detail below, secures tube shaft 32 to port cover 12.

Figure 3:
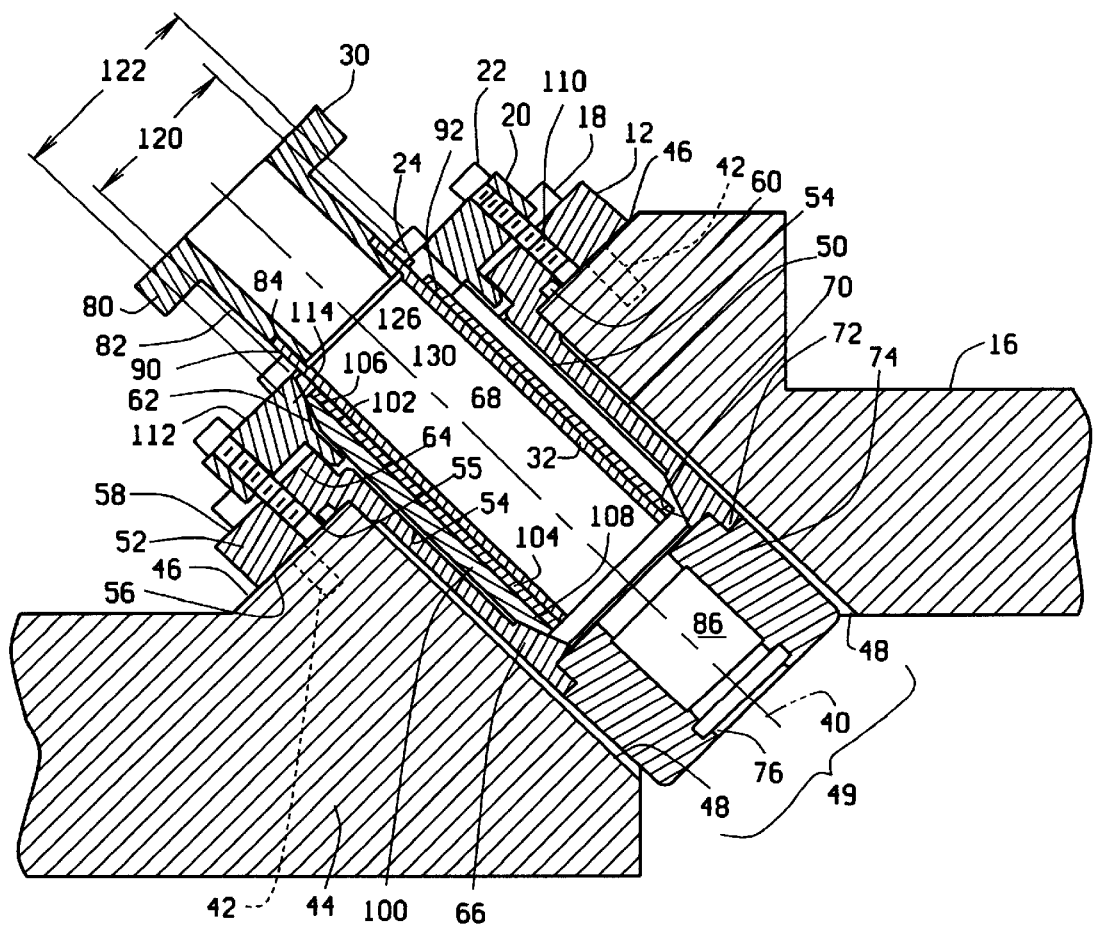
FIG. 3 is a vertical cross-sectional view taken along plane 3—3 shown in FIG. 1.

FIG. 3 is a vertical cross-sectional view of mounting assembly 10 taken along plane 3—3 shown in FIG. 1. Port cover 12 is mounted to microscope 16 with threaded fasteners 18 which extend through port cover 12 into openings 42 within microscope 16. Port cover 12 provides a mounting structure for the detecting unit (not shown) to mount against and maintains a vacuum supplied by a vacuum pump (not shown) housed within microscope 16. Microscope 16 includes a body 44 which includes an angled surface 46 and walls 48 which define an opening 49. Angled surface 46 is substantially smooth and includes a plurality of openings (not shown) sized and positioned to receive threaded fasteners 18.

Port cover 12 includes an elongate body 50 and an integral annular ring 52 which defines an opening 54. Annular ring 52 includes a plurality of openings 55 sized to receive threaded fasteners 22 which extend through collet clamp 20. Annular ring 52 has an inner surface 56 and an outer surface 58. Inner surface 56 and outer surface 58 are substantially flat. Openings 55 extend through annular ring 52 from outer surface 58 to inner surface 56. Annular ring 52 also includes an annular groove 60 which is sized to receive an o-ring (not shown). Annular groove 60 extends from inner surface 56 towards outer surface 58. Port cover 12 mounts to microscope 16 such that inner surface 56 and angled surface 46 are in mating contact. As such, the o-ring positioned in annular groove 60 is in sealable contact with angled surface 46 and annular ring 52. Outer surface 56 includes a shoulder 62.

Elongate body 50 is unitary with annular ring 52 and extends inwardly from annular ring 52 towards microscope 16. Elongate body 50 has a first end 64 positioned adjacent annular ring 52 and a second end 66 positioned at a distant proximity from annular ring 52. First end 64 includes a shoulder 68 which is in contact with walls 48 in close proximity to angled surface 46. Elongate body 50 is substantially smooth and contacts walls 48 at shoulder 68. Second end 66 includes a plurality of integral wedges 70 which extend radially inward towards axis of symmetry 40. Second end 66 also includes a substantially annular ring 72 which extends from elongate body 50 at second end 66 to engage a front section 74 of port cover 12. Front section 74 is welded to second end 66 and extends towards microscope 16. Front section 74 includes an opening 76 which is substantially symmetrically with axis of symmetry 40 and which extends through front section 74.

Detecting unit flange 14 includes mounting body 30 and tube shaft 32. Mounting body 30 has an upper body 80 which is substantially rectangular in shape and an elongate body 82 which extends from upper body 80 towards microscope 16. Elongate body 82 includes a shoulder 84. Tube shaft 32 engages shoulder 84 and is attached to mounting body 30 at shoulder 84. Tube shaft 32 extends into opening 49 towards microscope 16 and is welded to a front section 86 of detecting unit flange 16. Front section 86 is disposed within front section 74 and is substantially coaxial with axis of symmetry 40 Detecting unit flange tube shaft 32 includes an outer surface 90 which is substantially smooth. A damping material 92 is attached to outer surface 90 with a glue (not shown). In one embodiment, the glue is structural epoxy and damping material 92 is a visco-elastic damping material available from E-A-R Specialty Composites, Indianapolis, Ind. In one embodiment, Alternatively, damping material 92 is not glued to detecting unit flange 14 or any other surface within mounting system 10. In another embodiment, mounting system 10 uses an actively damped approach including piezo-electric damping elements (not shown). The piezo-electric damping elements are substituted for damping material 92.

Three collets 100 are glued to damping material 92 and are disposed between port cover 12 and damping material 92. Collets 100 include a first end 102 and a second end 104. First end 102 is beveled to form a first wedge 106 and second end 104 is beveled to form a second wedge 108. Collets 100 have lengthwise trapezoidal cross-sectional profiles and are substantially parallel to axis of symmetry 40. Additionally, collets 100 are equally spaced arcuately with respect to axis of symmetry 40 and tube shaft 32.

Collet clamp 20 is disposed around detecting unit flange tube shaft 32. Collet clamp 20 includes openings 110 through which fasteners 22 extend to mount collet clamp 20 to port cover 12. Collet clamp 20 has an upper surface 112 which is substantially flat and a lower surface 114 which is also substantially flat. Collet clamp 20 includes opening 24 which has a first diameter 120 at upper surface 112 and a second diameter 122 at lower surface 114. Second diameter 122 is machined larger than first diameter 120 and as such, a frusto-conical surface 126 extends between upper surface 112 and lower surface 114. As fasteners 22 tighten collet clamp 20 to port cover 12, conical surface 126 contacts collets 100 and forces collets 100 radially towards tube shaft 32 in a clamping manner. A substantially annular ring 130 extends from lower surface 114 towards microscope 16. Annular ring 130 is substantially coaxial with axis of symmetry 40 and engages port cover 12 shoulder 62 when collet clamp 20 is mounted to port cover 12. Cylindrical arm 130 prevents collets 100 from being misaligned while collet clamp 20 is tightened to port cover 12.

In operation, port cover 12 is secured to microscope 16 using fasteners 18. Damping material 92 is glued to detecting unit flange 14 tube shaft 32. Detecting unit flange 14 is inserted through port cover opening 53 into microscope opening 49. Collet clamp 20 is then attached to port cover 12 with fasteners 22. As fasteners 22 are tightened, wedges 66 on port cover 12 and conical surface 126 engage beveled wedges 106 and 108 and force collets 100 to clamp against damping material 92 and secure tube shaft 32 to port cover 12. The clamping provides a structural load path through which any vibrations induced by the detecting unit are transmitted through damping material 92 to port cover 12.

Figure 4:
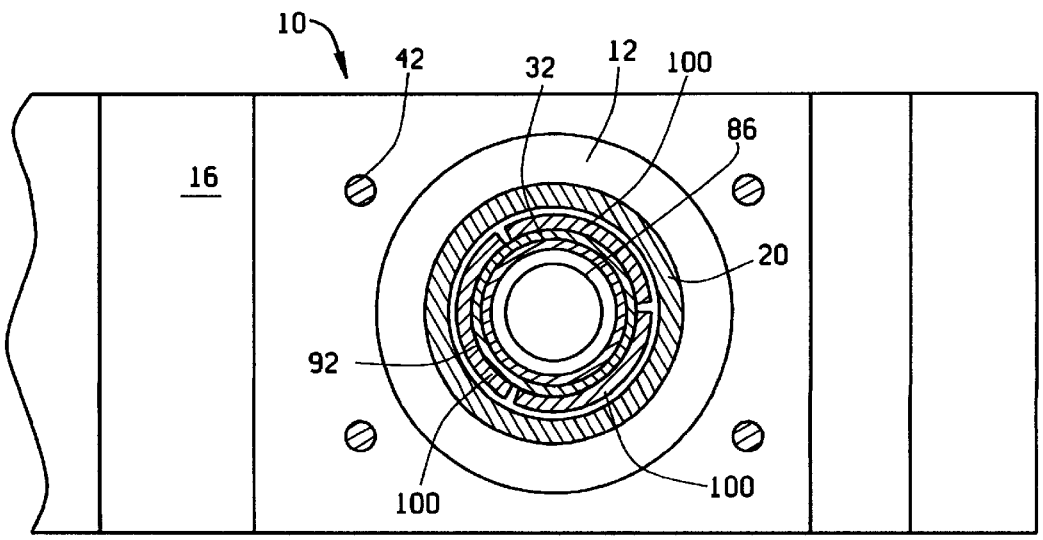
FIG. 4 is a top cross-sectional view taken along plane 4—4 shown in FIG. 2.

FIG. 4 is a top cross-sectional view of mounting system 10 taken along plane 4—4 shown in FIG. 2. Mounting system 10 includes port cover 12 which is attached to microscope 16 with fasteners 18(shown in FIG. 1). Microscope 16 includes openings 42 which permit the fasteners to secure port cover 12 to microscope 16. Mounting system 10 also includes collet clamp 20 which is mounted against port cover 12. Three collets 100 are positioned within collet clamp 20 and are arcuate in shape when viewed from 4—4. Collects 100 are attached to damping material 92 with glue. Additionally, collets 100 are evenly spaced equidistant from each other circumferentially around tube shaft 32. Tube shaft 32 is attached to front section 86.

The above described mounting system for mounting an X-ray detector to an electron microscope is cost-effective, easy to assemble, and highly effective. The system includes a port cover including integral wedges, which in combination with a collet cover including integral wedges, firmly secures a detecting unit flange to a microscope. The detecting unit flange is a mounting interface between an X-ray detector unit and an electron microscope. Furthermore, the system uses a damping system that is inexpensive and highly effective when compared to other damping mounting systems. As such, a cost effective and highly effective mounting system is provided.

While the invention has been described in terms of various specific embodiments, those skilled in the art will recognize that the invention can be practiced with modification within the spirit and scope of the claims.

What is claimed is:

1. A mounting system for mounting an X-ray detecting unit on a microscope, said mounting system comprising:
    a port cover comprising at least one integral wedge configured to secure the detecting unit to the port cover;
    a plurality of fasteners to secure said port cover to the microscope;
    a mounting interface for extending through said port cover; and
    a damping system attached to said mounting interface.

2. A mounting system in accordance with claim 1 wherein said damping system comprises a plurality of collets, a collet clamp configured to secure said collets and the detecting unit to the microscope, and a damping material attached to said mounting interface.

3. A mounting system in accordance with claim 2 wherein said plurality of collets comprises three collets.

4. A mounting system in accordance with claim 2 wherein said damping material is glued to the detecting unit.

5. A mounting system in accordance with claim 4 wherein said damping material is a visco-elastic damping material.

6. A mounting system in accordance with claim 2 wherein said collets are attached to said damping material.

7. A mounting system in accordance with claim 6 wherein said collets are glued to said damping material.

8. A mounting system in accordance with claim 2 wherein said collet clamp comprises an annular body and a plurality of integral wedges.

9. A mounting system in accordance with claim 2 wherein said port cover comprises a plurality of integral wedges.

10. A method for mounting an X-ray detecting unit on an electron microscope using a mounting system, the mounting system including a port cover, a plurality of fasteners for extending through the port cover, a mounting interface for extending through the port cover, and a damping system for being positioned within the port cover, the port cover including at least one integral wedge, said method comprising the steps of:
    attaching the mounting system including a damping system positioned within the port cover to the electron microscope; and
    attaching the X-ray detecting unit to the mounting system, such that the port cover integral wedge secures the detecting unit to the port cover.

11. A method in accordance with claim 10 further comprising the step of attaching the damping system to the mounting interface.

12. A method in accordance with claim 11 wherein the damping system includes a plurality of collets, a collet clamp to secure the collets and the detecting unit, and a damping material attached to the detecting unit, said method further comprising the step of attaching the damping material to the detecting unit.

13. A method in accordance with claim 12 wherein the damping material is a visco-elastic damping material, said step of attaching the damping system to the mounting interface comprises the step of gluing the damping material to the mounting interface.

14. A method in accordance with claim 13 wherein the plurality of collets includes three collets, said step of attaching the damping system to the mounting interface further comprises the step of attaching the three collets to the mounting interface.

15. A method in accordance with claim 14 wherein the step of attaching the damping system to the mounting interface further comprises the step of gluing the collets to the damping material.

16. A method in accordance with claim 11 wherein the step of attaching the mounting system to the electron microscope further comprises the step of attaching the port cover to the microscope using the plurality of fasteners.

17. A method in accordance with claim 11 wherein the port cover includes a plurality of integral wedges positioned to engage the detecting unit, said method further comprising the step of positioning the integral wedges within the microscope.

18. A method in accordance with claim 17 wherein the damping system includes a collet clamp including a plurality of integral wedges, said step of attaching the X-ray detecting unit on the electron microscope further comprises the step of tightening the collet clamp so that the integral wedges engage and secure the X-ray detecting unit.

19. A mounting system comprising:
    a port cover configured to attach to a microscope;
    a mounting interface for extending through said port cover; and
    a damping system attached to said mounting interface, and comprising at least one collet, said port cover configured to engage said damping system collet.

20. A mounting system in accordance with claim 19 wherein said damping system comprises a damping material, a plurality of collets positioned adjacent said damping material, and a collet clamp configured to secure said collets to said microscope.

21. A mounting system in accordance with claim 19 wherein said damping material is a visco-elastic damping material, said collets glued to said damping material.

22. A mounting system in accordance with claim 20 wherein said plurality of collets comprises three collets.

23. A mounting system in accordance with claim 21 wherein said damping material is attached to said mounting interface.

24. A mounting system in accordance with claim 21 wherein said collet clamp comprises a plurality of integral wedges.

25. A mounting system in accordance with claim 24 wherein said plurality of integral wedges are positioned within said microscope.

26. A mounting system in accordance with claim 21 wherein said port cover comprises a plurality of integral wedges.

27. A mounting system in accordance with claim 21 wherein said mounting system is configured to secure an X-ray detector unit to a microscope.

28. A mounting system in accordance with claim 21 further comprising a plurality of fastener assemblies configured for extending through said port cover.

* * * * *

UNITED STATES PATENT AND TRADEMARK OFFICE
CERTIFICATE OF CORRECTION

| | | |
|---|---|---|
| PATENT NO. | : 6,242,748 B1 | Page 1 of 1 |
| DATED | : June 5, 2001 | |
| INVENTOR(S) | : Gallagher et al. | |

It is certified that error appears in the above-identified patent and that said Letters Patent is hereby corrected as shown below:

Column 3,
Line 38, after the number 40, insert a new paragraph.

Column 4,
Line 19, delete "66" and substitute therefore -- 70 --.

Signed and Sealed this

Twelfth Day of March, 2002

Attest:

Attesting Officer

JAMES E. ROGAN
Director of the United States Patent and Trademark Office